(12) United States Patent
Huppertz

(10) Patent No.: US 10,598,513 B2
(45) Date of Patent: Mar. 24, 2020

(54) METHOD AND SYSTEM FOR COMPUTING THE PHASE SHIFT OR AMPLITUDE OF A THREE PHASE SYSTEM

(71) Applicant: TDK—Micronas GmbH, Freiburg (DE)

(72) Inventor: Juergen Huppertz, Freiburg (DE)

(73) Assignee: TDK—Micronas GmbH, Freiburg (DE)

( * ) Notice: Subject to any disclaimer, the term of this patent is extended or adjusted under 35 U.S.C. 154(b) by 216 days.

(21) Appl. No.: 15/646,357

(22) Filed: Jul. 11, 2017

(65) Prior Publication Data

US 2018/0017411 A1    Jan. 18, 2018

(30) Foreign Application Priority Data

Jul. 15, 2016   (DE) .................. 10 2016 113 126

(51) Int. Cl.
| | |
|---|---|
| *G01C 9/00* | (2006.01) |
| *G01D 5/14* | (2006.01) |
| *G06F 7/544* | (2006.01) |
| *G01R 33/07* | (2006.01) |

(52) U.S. Cl.
CPC .............. *G01D 5/145* (2013.01); *G01R 33/07* (2013.01); *G06F 7/5446* (2013.01)

(58) Field of Classification Search
None
See application file for complete search history.

(56) References Cited

U.S. PATENT DOCUMENTS

| | | | |
|---|---|---|---|
| 8,736,258 B2 | 5/2014 | Trontel | |
| 9,297,836 B2* | 3/2016 | Singh | .............. G01R 15/20 |
| 2015/0077093 A1* | 3/2015 | Saito | ............... G01D 5/12 |
| | | | 324/207.13 |
| 2019/0235011 A1* | 8/2019 | Pinney | ........... G01B 11/0616 |

FOREIGN PATENT DOCUMENTS

| | | |
|---|---|---|
| DE | 10320057 | 12/2004 |
| DE | 10 2010 003 292 A1 | 11/2011 |
| DE | 102010027166 A1 | 1/2012 |
| DE | 10 2013 020 730 A1 | 6/2014 |
| DE | 102013000432 A1 | 7/2014 |
| DE | 10 2014 109 693 A1 | 1/2016 |
| DE | 102015101363 A1 | 8/2016 |
| EP | 1 471 332 A1 | 10/2004 |

* cited by examiner

*Primary Examiner* — Aditya S Bhat
(74) *Attorney, Agent, or Firm* — 24IP Law Group USA, PLLC; Timothy Dewitt

(57) ABSTRACT

A method and system for computing the phase shift or the amplitude of an electromagnetic three-phase system. The method comprises the following steps of: detecting vector values corresponding to an electromagnetic quantity by three sensors, the three sensors delivering signals that are offset from each other substantially by 0°, 120° and 240°; computing changed vector values by logically adjusting one of the detected vector values to a phase of 0°; and iteratively computing the phase shift of the three-phase system using the changed vector values.

5 Claims, 3 Drawing Sheets

US 10,598,513 B2

METHOD AND SYSTEM FOR COMPUTING THE PHASE SHIFT OR AMPLITUDE OF A THREE PHASE SYSTEM

CROSS-REFERENCE TO RELATED APPLICATIONS

This application claims benefit of and priority to German Patent Application DE 10 2016 113 126, filed on 15 Jul. 2016. The entire disclosure of German Patent Application DE 10 2016 113 126, is hereby incorporated by reference.

BACKGROUND OF THE INVENTION

Field of the Invention

The invention relates to a method for computing the phase shift or the amplitude of an electromagnetic three-phase system and an apparatus for carrying out the method and computing the angle.

Brief Description of the Related Art

So far, the rotational angle of a magnetic vector in a three-phase system, for example a three-phase motor, has been processed using a so-called Clarke transformation (also referred to as an alpha-beta transformation), which converts the data of the three-phase system into a right-angled coordinate system and computes the rotational angle subsequently using an algorithm. Typically, the so-called Cordic algorithm is used for this computation.

The method so far has the disadvantage that an additional computing step is required at the outset of the method in order to decide in which quadrant the magnetic field vector is disposed.

Other methods for the contactless detection and computation of the rotational angle are known. For example, from the U.S. Pat. No. 8,736,258 (Trontelj) a method is known which uses a multiplicity of magnetic sensor elements in an integrated circuit. The integrated circuit is arranged below a permanent magnet. The signals of the magnetic sensor elements are combined in order to detect the rotational angle.

From the published German application DE 103 20 057 A1 (Schödlbauer) an angle reader with Hall effect elements is known. The angle reader has eight horizontal Hall sensor structures on a semiconductor substrate, said Hall sensor structures being arranged at an angular distance of 45° along a circular line around a symmetry center. These eight sensors in sum form four sensitivity axes, of which two can be used together in each case as an independent angle sensor. The angle reader can determine the angle of a rotatably supported permanent magnet that is arranged above the symmetry sensor.

In this previously known method, the computation steps are relatively complicated.

SUMMARY OF THE INVENTION

A simplified method is proposed for computing the amplitudes and/or the phase shift of an electromagnetic three-phase system which includes the detection of vector values corresponding to an electromagnetic quantity by at least three sensors. These three sensors deliver three values as the vector values, which are offset substantially by 0°, 120° and 240°. The vector values are reset to a phase of 0° by logical turning back. The phase shift and/or the amplitude of the three-phase system can be computed on the basis of a more thorough computation. In one aspect of the invention, six sensors are used for detecting the signals. These six sensors are arranged at an angular distance of 60° on a circular line around a symmetry center. The measured values from the respectively oppositely disposed sensors are combined in order to deliver the signals.

The method is used for example in a system for computing a value of a rotational angle, wherein a processor is used in order to carry out the method. The method and the system can be used in a brushless electric motor, for example.

BRIEF DESCRIPTION OF THE DRAWINGS

The invention will now be explained in more detail with reference to the following figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention. This invention becomes more obvious when reading the following detailed descriptions of some examples as part of the disclosure under consideration of the enclosed drawings. Referring now to the attached drawings which form a part of this disclosure. There are shown:

DETAILED DESCRIPTION

The object of the present invention is fully described below using examples for the purpose of disclosure, without limiting the disclosure to the examples. The examples present different aspects of the present invention. To implement the present technical teaching, it is not required to implement all of these aspects combined. Rather, a person skilled in the art will select and combine those aspects that appear sensible and required for the corresponding application and implementation.

Figure 1:
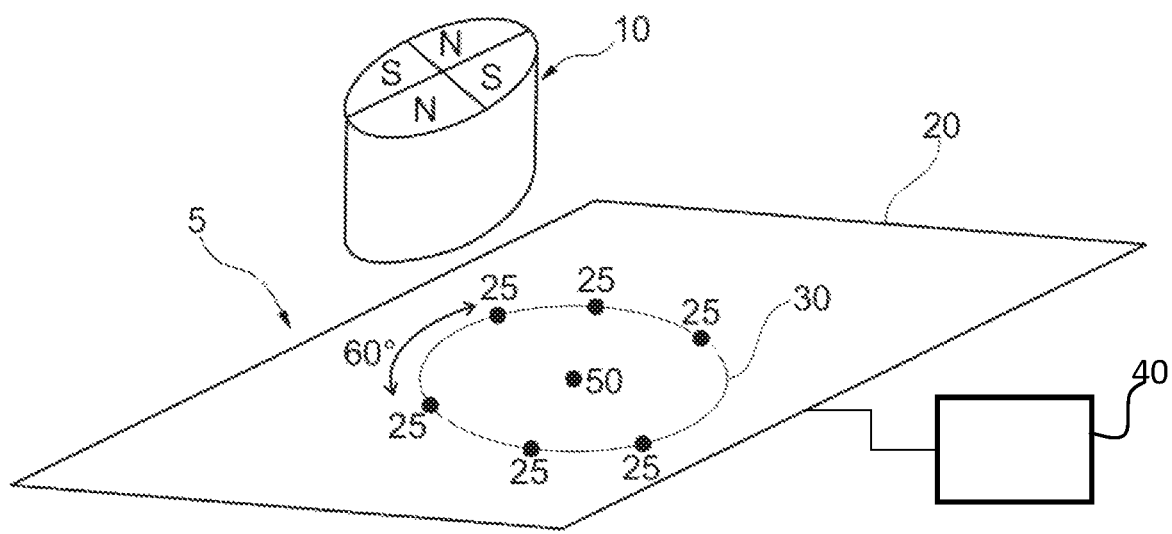
FIG. 1 is an overview of a rotatable permanent magnet and the sensor in an integrated circuit.
Figure 2:
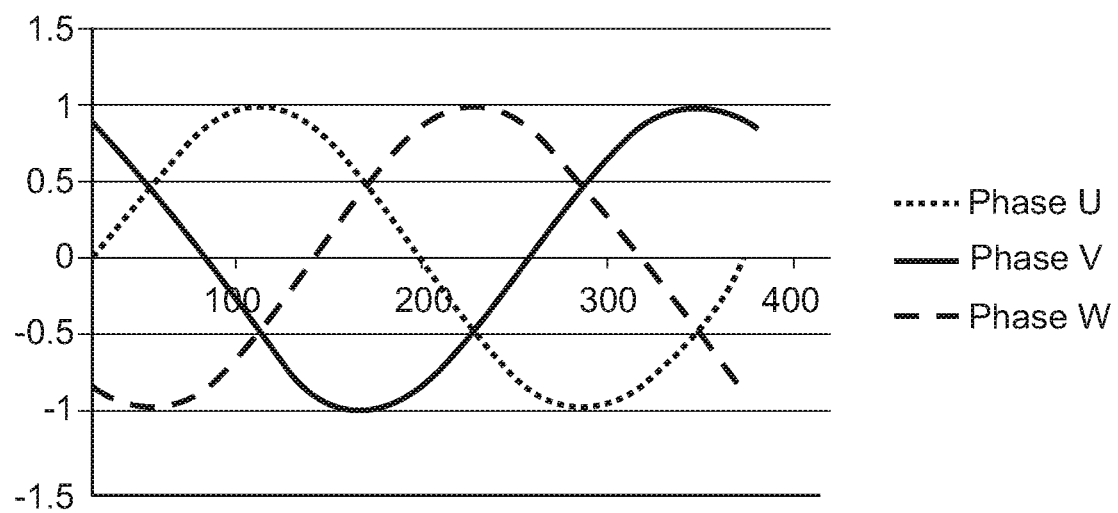
FIG. 2 is the values of a three-phase system.

FIG. 1 shows an overview of an angle detection system 5 of the present description, which computes the rotational angle φ of a rotatable permanent magnet 10. The rotatable permanent magnet 10 in the represented embodiment is a four-pole magnet and is arranged above a sensor plate 20. The sensor plate 20 has six sensors for detecting the magnetic field of the permanent magnet 10, which are arranged at an angular distance of approximately 60° on a circular line 30 around a symmetry center 50. The sensors 25 are horizontal Hall effect sensors which, for example, can deliver signals that correspond to the value of the detected magnetic field.

The signals from the respectively oppositely disposed sensors 25, i.e. offset by 180° in each case, can be combined in order to deliver one single signal Su, Sv, Sw for each pair. This combination is represented in FIG. 1 and shows the normalized signals Su, Sv, Sw for the three field vectors U, V and W, which are combined from the pairs of sensors 25.

The angle detection system 5 also includes a processor 40 which receives the signals from the sensors 25 and processes these according to the following method.

Figure 3:
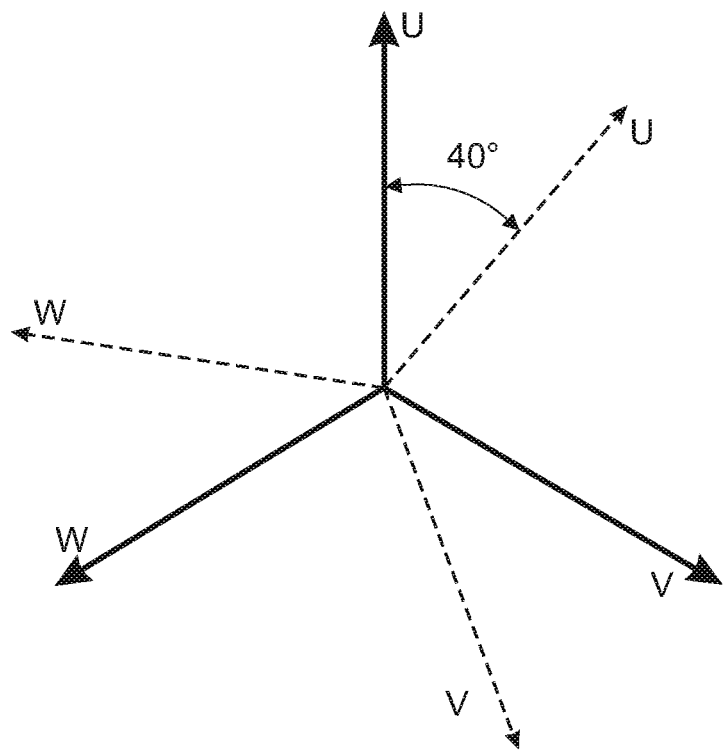
FIG. 3 is the magnetic vector values.

FIG. 3 shows the respective three magnetic field vectors U, V and W. The present invention is based on the idea of turning back one of these vectors, for example the U vector, to an angle of 0°, to be able to thus compute the angle. The rotational angle φ can be computed subsequently using the known CORDIC method. Accordingly, the present invention relates to the expansion of the CORDIC method to a three-phase system.

The method for computing the rotational angle φ is carried out step by step using the following rules. From the three measured sensor signals Su, Sv, Sw and a rotational angle φ, new signals Su', Sv', Sw' and a new rotational angle φ' are computed:

$$Su'=Su-A*(Sv-Sw), \quad (1)$$

$$Sv'=Sv-A*(Sw-Su), \quad (2)$$

$$Sw'=Sw-A*(Su-Sv), \quad (3)$$

$$\varphi'=\varphi+R*\arctan(\sqrt{3}*2^n) \quad (4)$$

The parameter A is chosen as $A=R*2^n$, wherein n is an integer. By choosing a power of two, the multiplication is reduced to a shift operation. The parameter R is either +1 or −1 and corresponds to the rotation direction, thus the sign of Sw−Sv.

The method starts with the measured values Su, Sv, Sw, with φ=0 and n=1 and is iterated several times. Thereby the iteration requires only addition operations and can do without multiplication. For computing the rotational angle φ, for example for an angle resolution of 1 degree, a coefficient table can be used with the values of $\arctan(\sqrt{3}*2^n)$ for n=1, 0, . . . , −10.

| Rotation | Rotation * √3 | arctan [°] | Max. rotation range |
|---|---|---|---|
| 2 | 3.46410 | 73.89789 | 222.77401 |
| 1 | 1.73205 | 60.00000 | 148.87612 |
| 0.5 | 0.86603 | 40.89339 | 88.87612 |
| 0.25 | 0.43301 | 23.41322 | 47.98273 |
| 0.125 | 0.21651 | 12.21635 | 24.56951 |
| 0.0625 | 0.10825 | 6.17839 | 12.35316 |
| 0.03125 | 0.05413 | 3.09820 | 6.17477 |
| 0.015625 | 0.02706 | 1.55023 | 3.07656 |
| 0.007813 | 0.01353 | 0.77526 | 1.52633 |
| 0.003906 | 0.00677 | 0.38765 | 0.75107 |
| 0.001953 | 0.00338 | 0.19383 | 0.36342 |
| 0.000977 | 0.00169 | 0.09691 | 0.16960 |
| 0.000488 | 0.00085 | 0.04846 | 0.07268 |
| 0.000244 | 0.00042 | 0.02423 | 0.02423 |

The column "max. rotation range" serves for verifying the method. From the uppermost line, it can be seen that the rotation range can detect a maximum value of 222°.

In a further embodiment, the signals Su', Sv', Sw' are scaled with the value cos(p) in each iteration step, wherein $p=\arctan(\sqrt{3}*2^n)$. Thus, for example (from (1))

$$Su'=\cos(p)*(Su-A*(Sv-Sw)) \quad (5)$$

Thereby the amplitude scaling of the components is maintained and the value of Su' at the end of the iteration corresponds to the amplitude of the original measured signal. The equation (5) requires three multiplications per iteration step, i.e. in 10 iteration steps a total of 30 multiplications are used. In order to minimize this computation effort, the equation can be computed at first without the scaling cos(p). The scaling is carried out once subsequently at the end of all iteration steps, since the product of all cos(p) is constant for a fixed number of iteration steps. Therefore, only three multiplications are carried out in this aspect. The value of the scaling can also be stored in the coefficient table.

The vector values can also be scaled while the iteration steps are carried out, so that the vector values do not become too large, so as to avoid overflows in the computer unit, for example. This scaling can be effected using a shift operation and has to be taken into account in the final scaling.

The method of the present description results from the properties of a three-phase system. It is known that the sum of the three field vectors U, V and W in a three-phase system must be zero. The following formula results therefrom:

$$\vec{p}_u+\vec{p}_v+\vec{p}_w=\vec{0} \quad (6)$$

The sum of the respective component, for example on the x-axis, is therefore:

$$p_{u,x}+p_{v,x}+p_{w,x}=0 \quad (7)$$

Each of the field vectors has the same length V:

$$|\vec{p}_u|\times|\vec{p}_v|=|\vec{p}_w|=V \quad (8)$$

This yields:

$$|\vec{p}_u|\times|\vec{p}_v|=|\vec{p}_w|=3V \quad (9)$$

The components on the respective x-axis and y-axis are:

$$p_{u,x}^2+p_{v,x}^2+p_{w,x}^2=3/2V^2 \quad (10)$$

$$p_{u,y}^2+p_{v,y}^2+p_{w,y}^2=3/2V^2 \quad (11)$$

$$|\vec{p}_u|=p_{u,x}^2+p_{u,y}^2=V^2 \quad (12)$$

Thus the component in the y-direction can be determined. From (12) the length of the vector is derived:

$$p_{u,y}^2=V^2-p_{v,x}^2 \quad (13)$$

The following formulas result therefrom:

$$p_{u,x}^2 = \frac{p_{u,x}^2 + p_{v,x}^2 + p_{w,x}^2}{1.5} - \frac{1.5}{1.5}p_{u,x}^2 \quad (14)$$

$$p_{u,x}^2 = \frac{-0.5p_{u,x}^2 + p_{v,x}^2 + p_{w,x}^2}{1.5} \quad (15)$$

Thus from (5):

$$p_{u,x}^2 = \frac{-0.5(-p_{v,x}^2 - p_{w,x}^2)^2 + p_{v,x}^2 + p_{w,x}^2}{1.5} \quad (16)$$

(11) is multiplied by 2:

$$p_{u,x}^2 = \frac{-p_{v,x}^2 - 2p_{v,x} \cdot p_{w,x} - p_{w,x}^2 + p_{v,x}^2 + p_{w,x}^2}{3} \quad (17)$$

With the binomial formula:

$$p_{u,y}^2 = \frac{(p_{v,x} - p_{w,x})^2}{3} \quad (18)$$

Like in (1) this yields:

$$p_{u,y} = \pm \frac{1}{\sqrt{3}} (p_{v,x} - p_{w,x}) \quad (19)$$

From the Cordic method, a rotation matrix is used. The new values $$\begin{pmatrix} x \\ y \end{pmatrix}$$

after each iteration are derived from the old values $$\begin{pmatrix} x_{old} \\ y_{old} \end{pmatrix}$$

as follows:

$$\begin{pmatrix} x \\ y \end{pmatrix} = \begin{pmatrix} \cos\varphi & -\sin\varphi \\ \sin\varphi & \cos\varphi \end{pmatrix} \begin{pmatrix} x_{old} \\ y_{old} \end{pmatrix} \quad (20)$$

Therefore:

$$\begin{pmatrix} x \\ y \end{pmatrix} = \frac{1}{\cos\varphi} \begin{pmatrix} 1 & -\tan\varphi \\ \tan\varphi & 1 \end{pmatrix} \begin{pmatrix} x_{old} \\ y_{old} \end{pmatrix} = \quad (21)$$

Let us now consider the computation of the X component for the U vector:

$$x = \frac{1}{\cos\varphi}(1 - \tan\varphi) \begin{pmatrix} p_{u,x,old} \\ p_{u,y,old} \end{pmatrix} \quad (22)$$

Thus from (19):

$$p_{u,x} = \frac{1}{\cos\varphi} \left[ p_{u,x,old} - \tan\varphi \frac{1}{\sqrt{3}} (p_{v,x,old} - p_{w,x,old}) \right] \quad (23)$$

Similar formulas yield the values for $p_{v,x}$ and $p_{w,x}$. To simplify the Cordic method, $\varphi$ is chosen such that $$\frac{1}{\sqrt{3}} \tan\varphi = 2^n$$

for the n-iteration. The root from using the root of 3 results from the modification of the Cordic method for the three-phase system.

Figure 4:
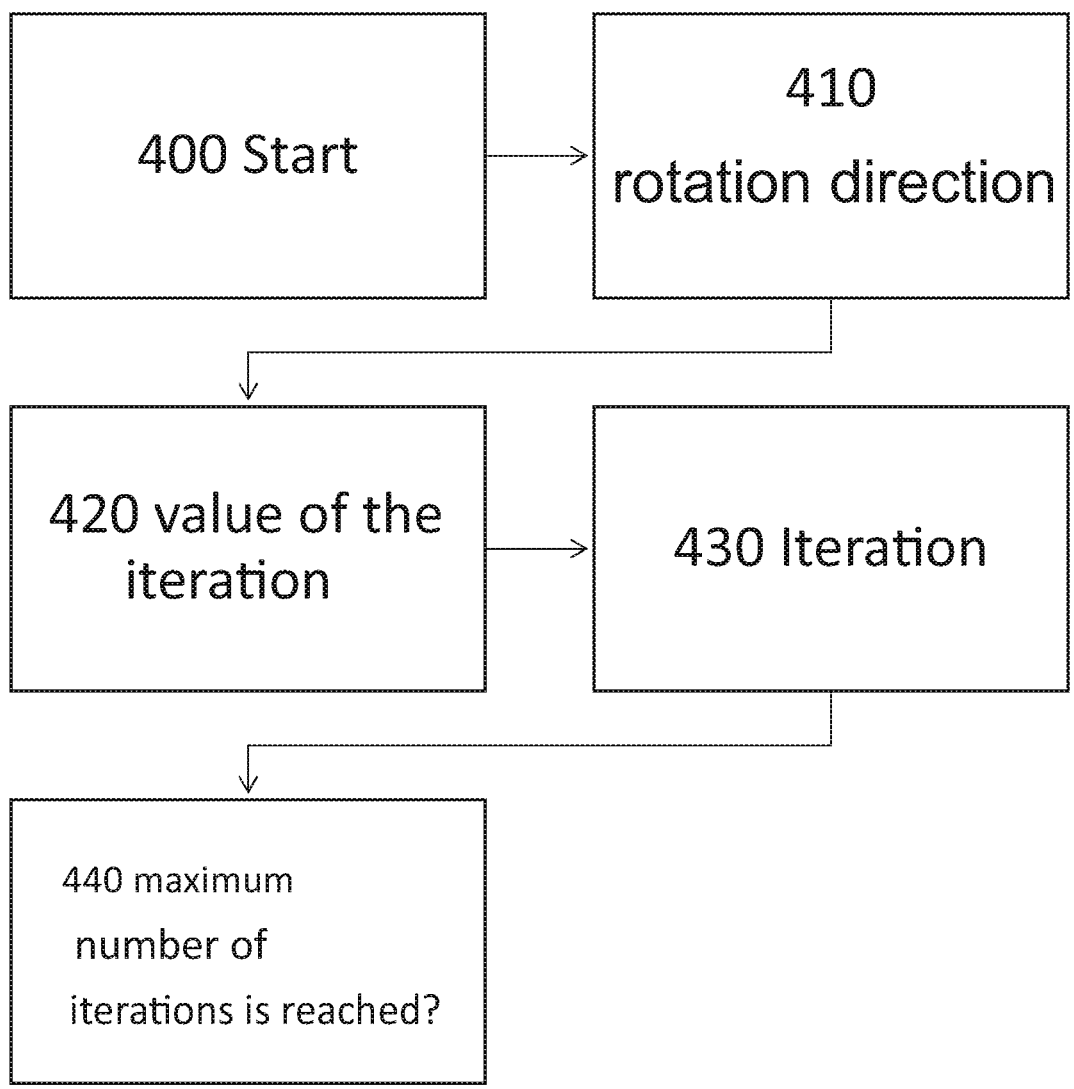
FIG. 4 is the sequence of the method.

Accordingly, an algorithm can be programmed with the following steps. This is shown in FIG. 4.

The starting point is the step 400. In this case, the angle is =0°. The iteration in question is the first one (i=1) and n=1. In the step 410 the rotation direction is determined by the sign (sgn) of the following formula:

$$\text{Rotation direction} = \text{sgn}(p_{w,x} - p_{v,x}) \quad (24)$$

The values and $p_{w,x}$ are computed in the step 420 as follows:

$$p_{u,x} = [p_{u,x,old} - 2^n(p_{v,x,old} - p_{w,x,old})] \quad (25)$$

$$p_{v,x} = [p_{v,x,old} - 2^n(p_{w,x,old} - p_{u,x,old})] \quad (26)$$

$$p_{w,x} = [p_{w,x,old} - 2^n(p_{u,x,old} - p_{v,x,old})] \quad (27)$$

Accordingly, the angle has the following value after the first iteration:

$$\text{Angle}_{new} = \text{Angle}_{old} + \text{Rotation direction} \cdot \arctan(2^n \cdot \sqrt{3}) \quad (28)$$

In the next step 430 the value of the iteration is raised by 1, i.e. iteration i=i+1, and the value of the rotation is reduced by half, i.e. N=n−1. As long as the value of the iteration lies below the maximum number of iterations (step 440), the computation in step 420 is repeated, wherein the value of the $\text{Angle}_{old}$ corresponds to the value $\text{Angle}_{new}$ computed in the previous iteration.

When the maximum number of iterations is reached, the value $\text{Angle}_{new}$ is taken.

The coefficient table with the arctan values (third column) is stored in the processor 40 and speeds up the computation. This coefficient table is implemented in the form of a "look-up" table, to which fast data access is possible.

As can be seen in this coefficient table, the change of the angle becomes increasingly small the greater the number of iterations there are. When the required accuracy has been reached, the computation is concluded.

This method can process the data from the three-phase system directly, since the algorithm can turn the vectors by over ±220° (first iteration in the coefficient table). Due to the rotation range that includes over 180°, the method is robust vis-à-vis erroneous decisions. By combining signals of oppositely disposed sensors 25, offsets are compensated as well.

The angle detection system 5 of the present invention is used, for example, in motors and inverters and in sensors, for example for accelerator pedals.

The foregoing description has been presented for purposes of illustration and description. It is not intended to be exhaustive or to limit the invention to the precise form disclosed, and modifications and variations are possible in light of the above teachings or may be acquired from practice of the invention. It is intended that the scope of the invention be defined by the claims appended hereto, and their equivalents. The entirety of each of the aforementioned documents is incorporated by reference herein.

LIST OF REFERENCE NUMBERS

5 angle detection system
10 permanent magnet
20 sensor plate
25 sensors
30 circular line
40 processor
50 symmetry center

What is claimed is:

1. A method for computing at least one of the phase shift or the amplitude of an electromagnetic three-phase system, comprising:

detecting vector values corresponding to an electromagnetic quantity by at least three sensors arranged at equal angles about a circle, the three sensors delivering signals that are offset from each other by 0°, 120° and 240°;

computing changed vector values by logically turning back one of the detected vector values to a phase of 0°; and iteratively computing the phase shift of the three-phase system using the changed vector values, wherein the iterative computation is carried out by a Cordic method.

2. The method according to claim 1, wherein the vector values are calculated by combining oppositely disposed sensors.

3. The method according to claim 1, wherein the iterative computation is carried out using a stored coefficient table.

4. A system for computing an angle, comprising:
at least three sensors for detecting an electromagnetic quantity, wherein the at least three sensors are arranged at equal angles about a circle;
a processor receiving values from the at least three sensors and computing one of the phase shift or the amplitude of an electromagnetic three-phase system, comprising:
detecting vector values corresponding to an electromagnetic quantity by three sensors, the three sensors delivering signals that are offset from each other by 0°, 120° and 240°;
computing changed vector values by logically turning back one of the detected vector values to a phase of 0°; and
iteratively computing the phase shift of the three-phase system using the changed vector values, wherein the iterative computation is carried out by a Cordic method.

5. The system according to claim 4, wherein the sensors are Hall sensors.

* * * * *